United States Patent
Darbel et al.

(10) Patent No.: US 7,194,021 B2
(45) Date of Patent: Mar. 20, 2007

(54) DIGITAL MATCHED FILTER

(75) Inventors: Nicolas Darbel, San Diego, CA (US); Sylvain Guilley, Berstett (FR)

(73) Assignee: STMicroelectronics, Inc., Carrollton, TX (US)

( * ) Notice: Subject to any disclaimer, the term of this patent is extended or adjusted under 35 U.S.C. 154(b) by 856 days.

(21) Appl. No.: 10/123,881

(22) Filed: Apr. 15, 2002

(65) Prior Publication Data

US 2003/0193995 A1 Oct. 16, 2003

(51) Int. Cl.
H04B 1/00 (2006.01)
(52) U.S. Cl. .................. 375/152; 375/143
(58) Field of Classification Search ......... 375/150, 375/152, 142, 350, 143, 145, 149, 343, 345, 375/368; 370/324, 335, 342, 515; 708/314, 708/422, 426
See application file for complete search history.

(56) References Cited

U.S. PATENT DOCUMENTS

| | | | |
|---|---|---|---|
| 5,627,855 A | 5/1997 | Davidovici | 375/207 |
| 5,715,276 A | 2/1998 | Tran et al. | 375/207 |
| 6,181,733 B1 * | 1/2001 | Shinde | 375/152 |
| 6,345,045 B1 * | 2/2002 | Yanagi | 370/342 |
| 6,768,768 B2 * | 7/2004 | Rao et al. | 375/142 |
| 2001/0030995 A1 * | 10/2001 | Gesret et al. | 375/150 |
| 2002/0034944 A1 * | 3/2002 | Tanno et al. | 455/434 |
| 2003/0021366 A1 | 1/2003 | Becker et al. | |
| 2003/0035402 A1 | 2/2003 | Suzuki et al. | |
| 2003/0099223 A1 * | 5/2003 | Chang et al. | 370/342 |

FOREIGN PATENT DOCUMENTS

| | | |
|---|---|---|
| WO | WO 00/14915 | 3/2000 |
| WO | WO 01/54040 | 8/2001 |
| WO | WO 01/89095 | 11/2001 |

OTHER PUBLICATIONS

Darbel, et al., "Reconfigurable Low Power Cell Search Engine for UMTS-FDD Mobile Terminals", IEEE Workshop, Piscataway, NJ on Oct. 16-18, 2002; IEEE, XP010616596, ISBN: 0-7803-7587-4.
European Search Report, EP 03 2354, dated Jun. 27, 2005.

* cited by examiner

*Primary Examiner*—Khanh Tran
*Assistant Examiner*—Sam K. Ahn
(74) *Attorney, Agent, or Firm*—Lisa K. Jorgenson; Andre M. Szuwalski

(57) ABSTRACT

A digital matched filter receives an input signal in natural order, correlates the input signal against a code and generates a filtered output signal in a permuted order with respect to the input signal. The code is a factorization of a first and second patterns. The filter includes a first filter to correlate against the first code and a second filter to correlate against the second pattern. A memory is included to store intermediate values produced from the first filter correlation operation. Certain ones of the intermediate values are selectively retrieved from memory in accordance with a unique addressing scheme for each second filter correlation operation. More specifically, the addressing scheme allows retrieved intermediate values to be reused in successive second filter correlations. The permuted order outputs of the filter are of no concern in many applications, like cell searching, where buffering is available.

27 Claims, 9 Drawing Sheets

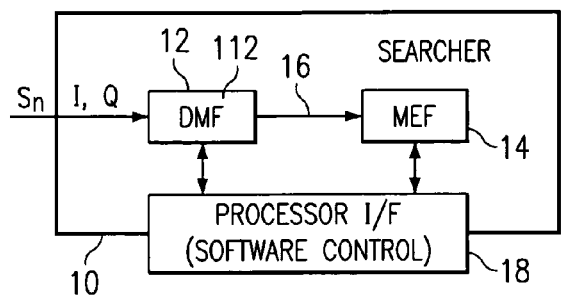
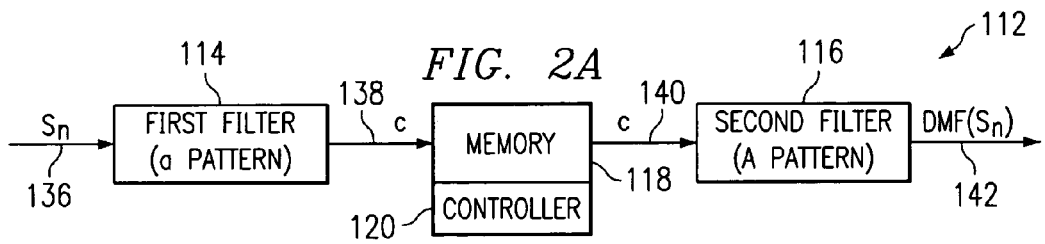
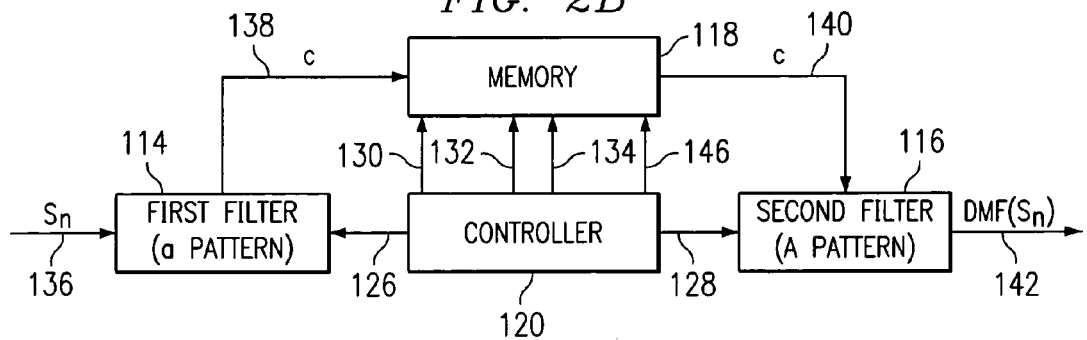
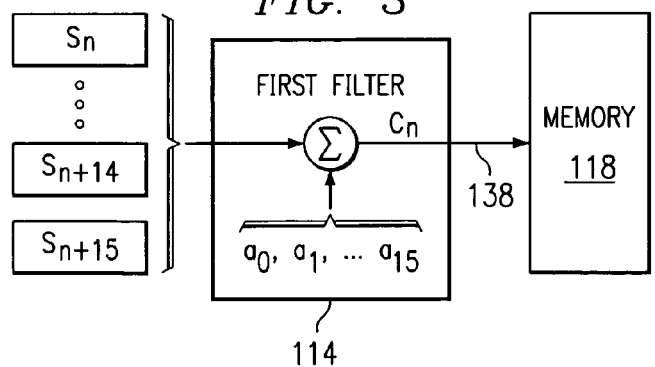

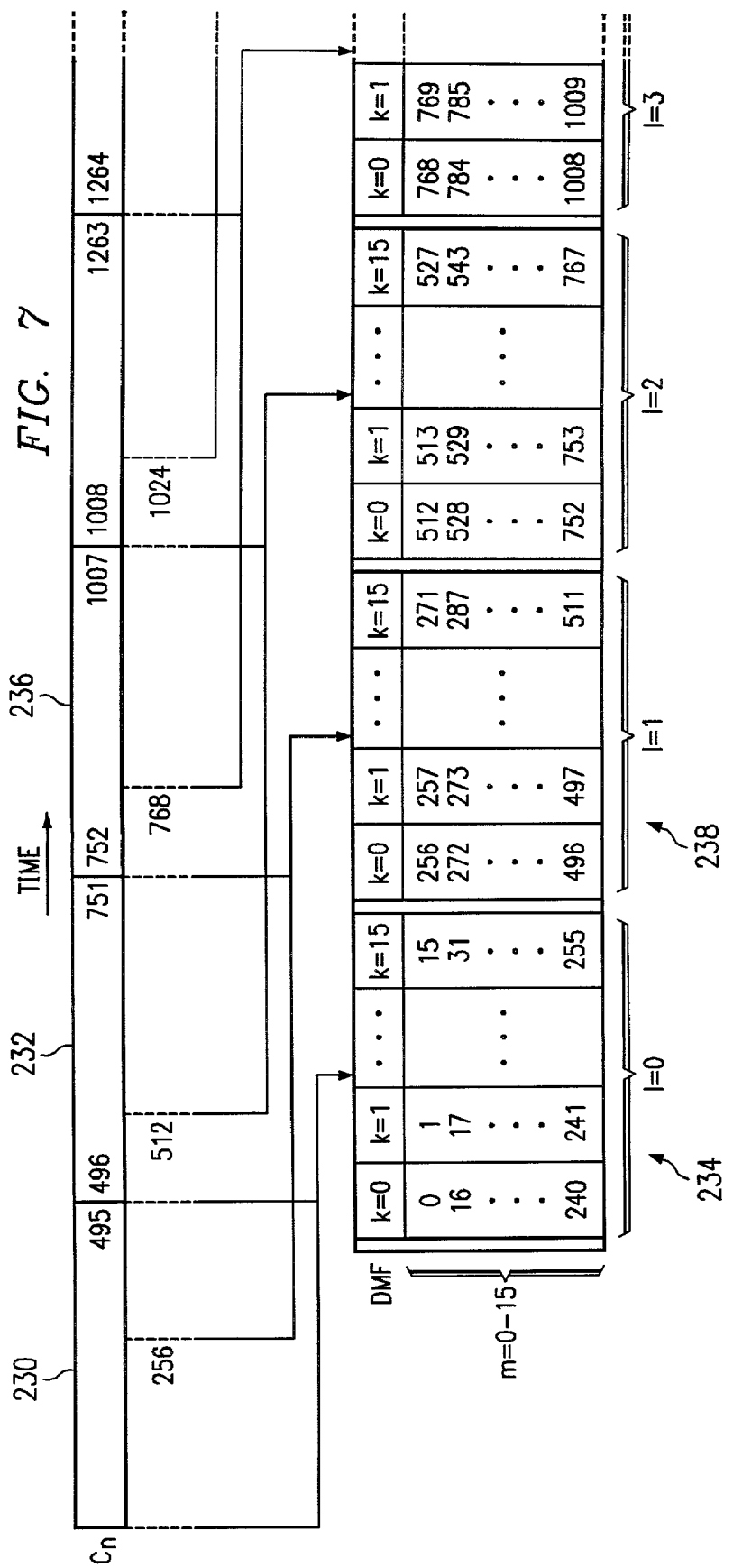

| MEMORY STATE | | CONDITIONS | | | ADDRESS (SPANNING FROM 0 TO 512) ON 9 BITS | | | | | | | | |
|---|---|---|---|---|---|---|---|---|---|---|---|---|---|
| LOWER SECTION | UPPER SECTION | c2x_cnt 11TH BIT | c2x_cnt 10TH BIT | c2x_cnt 5TH BIT | $A_8$ | $A_7$ | $A_6$ | $A_5$ | $A_4$ | $A_3$ | $A_2$ | $A_1$ | $A_0$ |
| | | | | | WRITE ADDRESSING | | | | | | | | |
| L | L | $b_{10}=0$ | $b_9=0$ | — | $b_9$ | $b_8$ | $b_7$ | $b_6$ | $b_5$ | $b_4$ | $b_3$ | $b_2$ | $b_1$ |
| P | L | $b_{10}=0$ | $b_9=1$ | — | $b_9$ | $b_8$ | $b_7$ | $b_6$ | $b_5$ | $b_4$ | $b_3$ | $b_2$ | $b_1$ |
| P | P | $b_{10}=1$ | $b_9=0$ | — | $b_9$ | $b_4$ | $b_3$ | $b_2$ | $b_1$ | $b_8$ | $b_7$ | $b_6$ | $b_5$ |
| L | P | $b_{10}=1$ | $b_9=1$ | — | $b_9$ | $b_4$ | $b_3$ | $b_2$ | $b_1$ | $b_8$ | $b_7$ | $b_6$ | $b_5$ |
| | | | | READ ADDRESSING (c2x_cnt BELOW IS OFFSET BY THE DMF LATENCY, i.e. BETWEEN 466 AND 512 CHIPS AFTER THE FIRST WRITE OPERATION) | | | | | | | | | |
| L | L | $b_{10}=0$ | $b_9=0$ | — | $b_4$ | $b_3$ | $b_2$ | $b_1$ | $b_0$ | $b_8$ | $b_7$ | $b_6$ | $b_5$ |
| P | L | $b_{10}=0$ | $b_9=1$ | $b_4=0$ | $\sim b_4$ | $b_3$ | $b_2$ | $b_1$ | $b_0$ | $b_8$ | $b_7$ | $b_6$ | $b_5$ |
| | | | | $b_4=1$ | $\sim b_4$ | $b_8$ | $b_7$ | $b_6$ | $b_5$ | $b_3$ | $b_2$ | $b_1$ | $b_0$ |
| P | P | $b_{10}=1$ | $b_9=0$ | — | $b_4$ | $b_8$ | $b_7$ | $b_6$ | $b_5$ | $b_3$ | $b_2$ | $b_1$ | $b_0$ |
| L | P | $b_{10}=1$ | $b_9=1$ | $b_4=0$ | $\sim b_4$ | $b_8$ | $b_7$ | $b_6$ | $b_5$ | $b_3$ | $b_2$ | $b_1$ | $b_0$ |
| | | | | $b_4=1$ | $\sim b_4$ | $b_3$ | $b_2$ | $b_1$ | $b_0$ | $b_8$ | $b_7$ | $b_6$ | $b_5$ |

*FIG. 10*

DIGITAL MATCHED FILTER

BACKGROUND OF THE INVENTION

1. Technical Field of the Invention

The present invention relates to hierarchical filters such as finite impulse response (FIR) and, in particular, to a digital matched filter.

2. Description of Related Art

With reference to the known cell search procedure in the UMTS-FDD standard, slot synchronization is acquired by correlating an input signal (S) with a 256-chip long sequence primary synchronization code (PSC) at the beginning of each time slot. More specifically, two data channels, one in phase (I) and one quadrature phase (Q), are filtered by an (N×M)-tap finite impulse response filter (in particular, N=M=16 for UMTS-FDD) to the primary synchronization code. The filtered output signal, or a direct transformation thereof (for example, an energy computation) is then stored in memory and accumulated over several time slots. An energy peak in the accumulated output signal corresponds to the possible starting location of a time slot.

Referring now to FIG. 1, there is shown a top level block diagram of a cell searcher 10. The searcher includes a digital matched filter (DMF) 12 and a maximum energy finder (MEF) 14. The digital matched filter 12 correlates the incoming samples (both I and Q) with the primary synchronization code pattern, and outputs an energy 16. This energy may be calculated for output as the correlation square norm or as a non-euclidian distance (such as a sum of absolute values). These calculated energies 16 are then delivered to the maximum energy finder 14. The maximum energy finder 14 operates to accumulate the energies 16 over time for the purpose of increasing signal to noise ratio (SNR) and the likelihood of detecting peak values. The highest accumulated energies are then selected by the maximum energy finder 14 as corresponding to the best correlation phases.

The cell search 10 further includes a processor interface (I/F) 18 that receives data from the digital matched filter 12 and maximum energy finder 14 for output and use elsewhere. For example, the interface 18 collects and delivers energy peaks, timings, noise estimates, and the like data as known by those skilled in the art, including information relating to the performed cell search step 1, step 2 and step 3 tasks for initial cell search and acquisition. As an example, the interface 18 may comprise an advanced peripheral bus (APB) interface. It will also be recognized by those skilled in the art that if the searcher 10 is implemented wholly in software, then a bus interface would not be necessary, and instead could be replaced by a software controller (as alternatively illustrated in FIG. 1).

It is common for at least the digital matched filter 12, if not the entire cell searcher 10 (and perhaps further the entire digital baseband circuit), to be manufactured as an integrated circuit (one or more integrated circuits may be implicated, perhaps with other functions as well). This integrated circuit is then utilized in a mobile environment and powered by a battery. Because battery power supply resources are limited in such applications, there is a need in connection with any implementation of the filter 12 for use in a mobile environment (in either hardware or software) to reduce power consumption.

As is also well known to those skilled in the art, the digital matched filter 12, especially one of the large size used in the cell searcher 10, takes up a significant amount of area when implemented in silicon. There is accordingly a need, not only for the silicon chip (or chip set) associated with the modem/cell searcher, but also in connection with any implementation of a hierarchical filter in silicon, to reduce silicon area consumption.

The present invention provides an improved architecture design for a digital matched filter that addresses the foregoing concerns.

SUMMARY OF THE INVENTION

A filtering operation performed in accordance with the present invention receives an input signal in a natural order. That input signal is then correlated against a code to produce filtered output signals. The filtered output signals, however, are produced from the correlation in a permuted order with respect to the received input signal.

More specifically, in a preferred embodiment, the filtering operation correlates an input signal against a code wherein the code is a factorization (or hierarchy) of a first and second patterns. The correlation performed by the filtering operation first filters the input signal with the first pattern to produce intermediate values in a natural order of the input signal. These intermediate values are stored in memory. Certain ones of the intermediate values are thereafter selectively retrieved from memory. The retrieved intermediate values are then second filtered with the second pattern such that successive second filtering operations advantageously reuse intermediate values used in prior correlations.

The writing of intermediate values to, and the reading of intermediate values from, the memory is accomplished using a unique addressing scheme. In accordance with that scheme, a first group of intermediate values produced from first filtering is written to addresses in memory in a linear order. A second group of intermediate values next produced from first filtering is overwritten on the first group addresses in a permuted order as the first group of intermediate values is being retrieved from the memory in that permuted order for second filtering. Next, a third group of intermediate values next produced from first filtering is overwritten on the second group addresses in a linear order as the second group of intermediate values is being retrieved from the memory in that linear order for second filtering.

The present invention still further comprises a cell searcher that utilizes a digital matched filter connected to a maximum energy finder. The digital matched filter receives an input signal in a natural order of the input signal, correlates that input signal against a primary synchronization code (PSC), and produces filtered outputs in a permuted order with respect to the input signal. The maximum energy finder receives the output energies in the permuted order and accumulates those energies over time to detect a peak corresponding to a possible start of a slot.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is a top level block diagram of a cell searcher;

FIG. 2A is a data flow diagram of a hierarchical digital matched filter in accordance with the present invention;

FIG. 2B is a block diagram of an exemplary implementation of the hierarchical digital matched filter of FIG. 2A;

FIG. 3 is a functional diagram illustrating the operation performed by the first filter and memory in the matched filter of FIGS. 2A and 2B;

FIG. 7 is a timing diagram illustrating the time-offset calculation of intermediate values and filter output values (in permuted order) in accordance with the preferred implementation of the matched filter;

FIG. 10 illustrates bit level representations of write and read addressing schemes.

DETAILED DESCRIPTION OF THE DRAWINGS

Figure 4A:
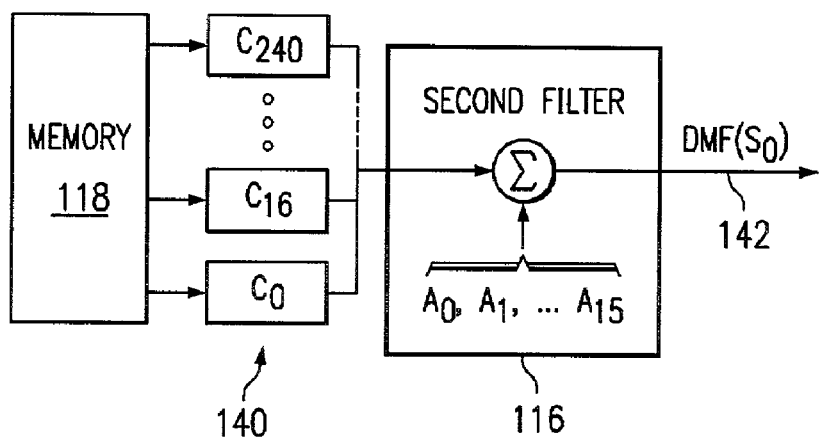
FIGS. 4A–4C are functional diagrams illustrating second filter operations in accordance with prior art functionality wherein successive correlations utilize new sets of intermediate data and produce natural order outputs.

Reference is now made to FIG. 2A wherein there is shown data flow diagram of a hierarchical digital matched filter 112 in accordance with the present invention. This filter 112 may be implemented in either a hardware or software configuration for use in a number of implementations including, for example, the cell searcher 10 illustrated in FIG. 1. The filter 112 includes a pair of finite impulse response filters 114 (N-tap) and 116 (M-tap). A memory 118 is positioned between the two filters 114 and 116. The first filter 114 receives an input signal ($S_n$) 136, performs a designated filtering operation thereon, and outputs a filtered output c (intermediate data) on data line 138 to the memory 118 for storage. Stored intermediate data c is then selectively retrieved from the memory 118 and passed on data line 140 to the second filter 116. The second filter 116 then performs a designated filtering operation on the received intermediate data c and outputs a filtered output energy signal (DMF) on line 142.

The filter 112 is designed to correlate the input signal 136 against a hierarchical code C that is a factorization of a first and second patterns, and may be written as follows:

$$C = A(j) \cdot a(i)$$

wherein: a(i), $0 <= i < N$, is the first pattern; and
A(j), $0 <= j < M$, is the second pattern.

Thus, the hierarchical code C accordingly takes on the form:

$$C = (A0 \cdot a0, A0 \cdot a1, \ldots, A0 \cdot a(N-1),$$

$$A1 \cdot a0, A1 \cdot a1, \ldots, A1 \cdot a(N-1), \ldots,$$

$$Aj \cdot a0, Aj \cdot a1, \ldots, Aj \cdot a(N-1), \ldots,$$

$$A(M-1) \cdot a0, A(M-1) \cdot a1, \ldots, A(M-1) \cdot a(N-1))$$

The hierarchical nature of the code C allows for the overall correlation process to occur in two stages. A first stage concerns the correlation of the input signal 136 against the first (a(i)) pattern using the first filter 114 to produce intermediate values $c_n$. A second stage concerns the correlation of the intermediate values $c_n$ against the second (A(j)) pattern using the second filter 116 to produce filtered output energy signal (DMF) on line 142.

Figure 4B:
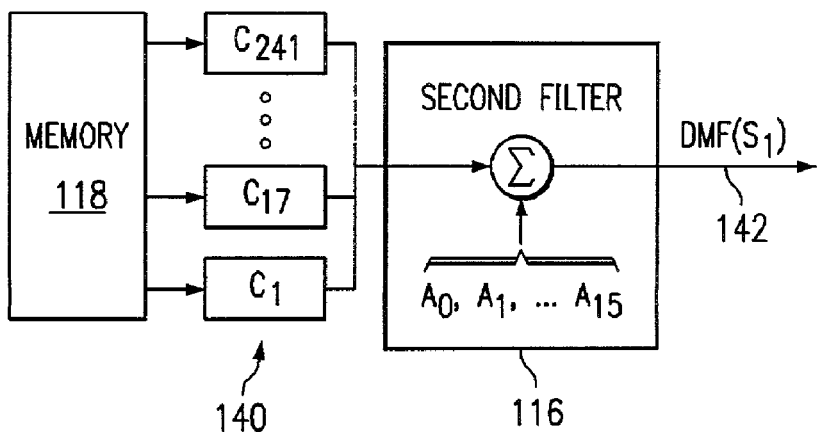
Figure 4C:
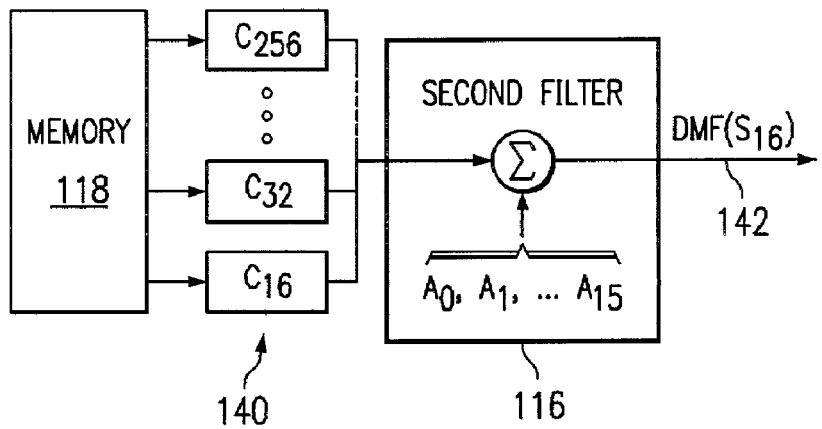

The intermediate values of $c_n$ that are computed by the first filter 114 are stored in memory 118. The prior art operates to retrieve these intermediate values from memory (or registers) in the same natural order they were stored for correlation in the second filter 116 generates filtered output signal (DMF) values in a corresponding natural order (DMF(0), then DMF(1), then DMF(2), and so on). However, this natural order processing operation requires a new set of M intermediate values of $c_n$ to be addressed and retrieved from the memory 118 for each signal (DMF) value calculation (in the second filter 116) as shown in FIGS. 4A–4C and discussed in more detail herein. This prior art addressing operation to retrieve a new set of M intermediate values of $c_n$ for each successive second filter correlation accordingly raises a bandwidth bottleneck concern and precludes achieving significant power and area consumption savings.

The present invention recognizes that the second filter 116 correlations producing filtered output signal (DMF) values which are offset by M (for example, $DMF(S_0)$ and $DMF(S_M)$) require substantially the same set of intermediate values $c_n$. More specifically, only one intermediate value of $c_n$ is additionally needed with the values used to calculate $DMF(S_0)$ in order to calculate $DMF(S_M)$. The addressing bandwidth bottleneck issue discussed above can thus be solved with the present invention by taking advantage of the foregoing recognition and having the second filter 116 reuse previously retrieved intermediate values of $c_n$ in successive second filter correlations. In particular, the present invention reuses intermediate values from past calculations and for many operations needs to only address and retrieve from memory 118 one intermediate value for each successive second filter 116 calculation. Reading the intermediate values in this manner presents a significant reduction in the number of memory 118 accesses required for successive second filter 116 correlations (i.e., one new intermediate value of $c_n$ versus a new set of M intermediate values of $c_n$). Less computational resources are accordingly needed. This contributes to a significant savings in power and area consumption. A software (as opposed to hardware) implementation of the filter is also feasible due to the fewer calculations and processing operations needed when intermediate values are reused.

Operation of the second filter 116 in the manner described immediately above will result in the production of filtered output signal (DMF) values in a permuted order with respect to the input signal (for example, first $DMF(S_0)$, then $DMF(S_M)$, and so on) instead of the natural order of the prior art. This permuted order output, however, is generally of no concern with the use of filter 112 because DMF values are often buffered for later use, and the particular order of their output does not matter.

The advantages of operation of the filter 112 in accordance with the method of the present invention may be better understood by considering a specific example. It will, of course, be understood that the example is illustrative of the invention and not a limitation of its utility in performing hierarchical filtering operations.

In the cell search procedure for the UMTS-FDD standard, slot synchronization is acquired by correlating an input signal over an entire time slot with a 256-chip long sequence primary synchronization code (PSC) that is sent at the beginning of each time slot to locate the start of the time slot. The primary synchronization code is generated by multiplying two 16-valued series or patterns (i.e., modulating one series with the other series) The PSC accordingly possesses the same format as the code C discussed above (where N=M=16). More specifically, a first one of those series has a length of sixteen (N=16) and is used at chip frequency (referred to as series or pattern "a"), and a second one of those series has a length of sixteen (M=16) and is used once every N chips (referred to as series or pattern "A"). The simplest implementation of this correlating operation is to match the incoming signal $S_n$ (where $S_n=I_n+jQ_n$) directly with N×M (16×16) primary synchronization code taps using a direct filtering operation as follows:

$$DMF(S_n) = \sum_{j=0}^{M-1}\left(A_j \cdot \sum_{i=0}^{N-1} a_i \cdot S_{n+16j+i}\right) \quad (1)$$

wherein: DMF is the filtered output signal (i.e., the input signal filtered by code C for example equal to the PSC);
"a" is real and comprises the first series component of the code C; and
"A" is also real and comprises the second series component of the code C.

This direct filtering operation requires the computation of N×M final output results and the use of a corresponding N×M finite impulse response filter as in the prior art. This presents an undesirable, very large, complex and power consuming filter implementation that it preferably avoided (especially in power and silicon area consumption sensitive implementations).

From Equation (1), and giving consideration to the hierarchical nature of the code C, it is recognized that the process for determining the DMF filtered output implicates two separate filtering operations.

First, an operation to identify intermediate values $c_n$ based on correlation processing in view of the "a" series may be performed as follows:

$$c_n = \sum_{i=0}^{N-1} a_i \cdot S_{n+i} \quad (2)$$

wherein: n is an index for grouping N consecutive pieces of input data.

These intermediate values of $c_n$ can be computed according to Equation (2) immediately as the necessary input data becomes available and then saved for later manipulation and further processing. For example, the intermediate value $c_0$ is computed by applying the N values of the "a" series against the input data $S_0, \ldots, S_{15}$ immediately upon the availability of the $S_{15}$ data. Next, when the $S_{16}$ data becomes available, the next intermediate value $c_1$ is computed by applying the same N values of the "a" series against the input data $S_1, \ldots, S_{16}$. This process repeats itself for each new piece of input data to produce a corresponding intermediate value $c_n$ that can be saved.

Notably, the correlation operation of Equation (2) can be performed by an i=N=16-tap finite impulse response filter. In the context of the filter 112 of the present invention shown in FIG. 2A, the first filter 114 may be used to correlate the incoming signal $S_n$ against the "a" series component of the primary synchronization code and output the intermediate values of $c_n$ on data line 138 to the memory 118 in natural order where they are stored at specified addresses (in a manner to be discussed in more detail herein). This operation is graphically illustrated in FIG. 3.

Second, an operation to identify the filtered output values DMF based on correlation processing in view of the "A" series may be performed as follows:

$$DMF(S_n) = \sum_{j=0}^{M-1} A_j \cdot C_{n+(16j)} \quad (3)$$

Notably, the correlation operation of Equation (3) can be performed by a j=M=16-tap finite impulse response filter. In the context of the filter 112 of the present invention, the second filter 116 may be used to correlate the previously calculated and saved intermediate values of $c_n$ against the "A" series component of the primary synchronization code and output the filtered output (DMF) values on line 142.

If the filtered output (DMF) values are calculated in the natural order of the received input signal $S_n$ (as in the prior art), it is recognized that each successive second filter 116 correlation requires the addressing and retrieval of a new set of M intermediate values of $c_n$. For example, the filtered output value $DMF(S_0)$ is computed by applying the M values of the "A" series against a set of n+(16j) index selected (previously computed and saved) intermediate values $c_0, c_{16}, \ldots, c_{224}, c_{240}$ (see, FIG. 4A). The next filtered output value $DMF(S_1)$ is then computed by applying the same M values of the "A" series against a new set of n+(16j) index selected (previously computed and saved) intermediate values $c_1, c_{17}, \ldots, c_{225}, c_{241}$ (see, FIG. 4B). Later in time, the filtered output value $DMF(S_{1})$ is computed by applying the same M values of the "A" series against another new set of n+(16j) index selected (previously computed and saved) intermediate values $c_{16}, c_{32}, \ldots, c_{240}, c_{256}$ (see, FIG. 4C). It will be recognized that this prior art operation for addressing and retrieving of a new set of M intermediate values of $c_n$ for each successive natural order DMF calculation is unacceptable because it requires significant addressing bandwidth for the memory 118 whose implementation would consume an unacceptable amount of power and silicon area.

It will be remembered from the discussion above that the intermediate values $c_0, c_{16}, c_{32}, \ldots, c_{240}$ are used by the second filter 116 to compute the filtered output value DMF $(S_0)$ (see, FIG. 4A) and that the intermediate values $c_{16}, c_{32}, \ldots, c_{240}, c_{256}$ are used by the second filter to compute the filtered output value $DMF(S_{16})$ (see, FIG. 4C). A comparison of the sets of intermediate values of $c_n$ used in each correlation reveals that the computation of $DMF(S_0)$ and $DMF(S_{16})$ require an almost identical set of intermediate values. More specifically, computing $DMF(S_{16})$ requires only one different intermediate value (i.e., the value $c_{25}$, in place of the value $c_0$) than is needed in computing DMF $(S_0)$. The present invention recognizes that some distinct advantages in processing and data handling may be obtained if $DMF(S_{16})$, instead of $DMF(S_1)$, were calculated following $DMF(S_0)$ because only a single read from the memory 118 (to obtain the next needed intermediate value $c_{256}$) is needed before performing the next (successive) correlation operation. This permuted order processing operation significantly reduces the amount of memory bandwidth needed for each correlation when considered in comparison to the prior art natural order implementation discussed above where each successive correlation requires the reading of a new set of M intermediate values.

In accordance with a preferred implementation of the filter 112, the present invention reuses for successive second filter 116 correlations, the intermediate values of $c_n$ that have already been retrieved from the memory 118. More specifically, while the intermediate values of $c_n$ are computed in natural order ($c_0$, then $c_1$, then $c_2$, and so on) using Equation (1) in the manner discussed above with respect to the operation of the first filter 114, the filtered output values $DMF(S_n)$ are then computed by the second filter 116 in an out of natural order (i.e., in a permuted order) fashion to take advantage of the intermediate values of $c_n$ that have already be retrieved from the memory 118.

The permuted operation to identify the filtered output values DMF based on correlation processing in view of the "A" series in accordance with the present invention may be performed as follows:

$$DMF(S_{Lxl+Nm+k}) = \sum_{j=0}^{M-1} A_j \cdot C_{N(m+j)+k+Lxl} \quad (4)$$

wherein: $L=M \times N$ is the filter length; l is an index that cycles such that $L \times l$ spans the periodicity of the filter (l has the slowest cycling period of any of the recited indices);

j=0,1,2, ..., M−1
k=0,1,2, ..., N−1;
m=0,1,2, ..., M−1;

the index m is related to the index k in a nested fashion such that the index m cycles through all possible values for each individual increment of the value of k; and $c_n$ denotes the indexed intermediate value itself, not necessarily the address of the value in the memory 118, which is instead given by:

n=(N(m+j)+k+L×l) mod mem_size where mem_size=2×M×N in a preferred implementation as discussed below.

The periodicity of the filter is equal to the buffer depth used at the filter output to accumulate DMF values for further processing (or transformation thereof). In the UMTS-FDD example, the periodicity is 2560-chips, and it will be remembered that N=M=16, and these values are utilized in the following discussion to identify specific intermediate values. These filtered output values DMF may be calculated according to Equation (4) from the previously calculated and saved intermediate values of c.

Figure 5A:
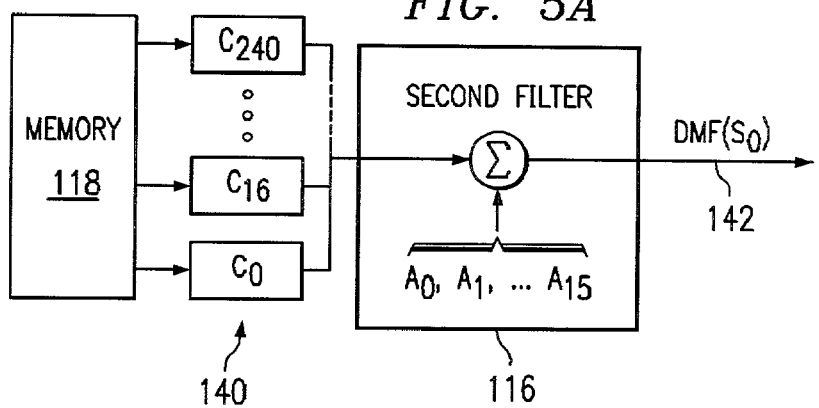
FIGS. 5A–5F are functional diagrams illustrating second filter operations in accordance with the present invention wherein successive correlations reuse intermediate data from prior correlations and produce permuted order outputs.
Figure 5B:
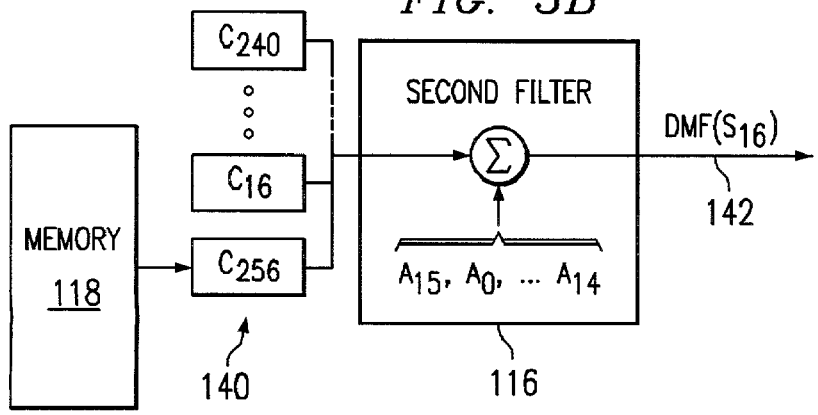
Figure 5C:
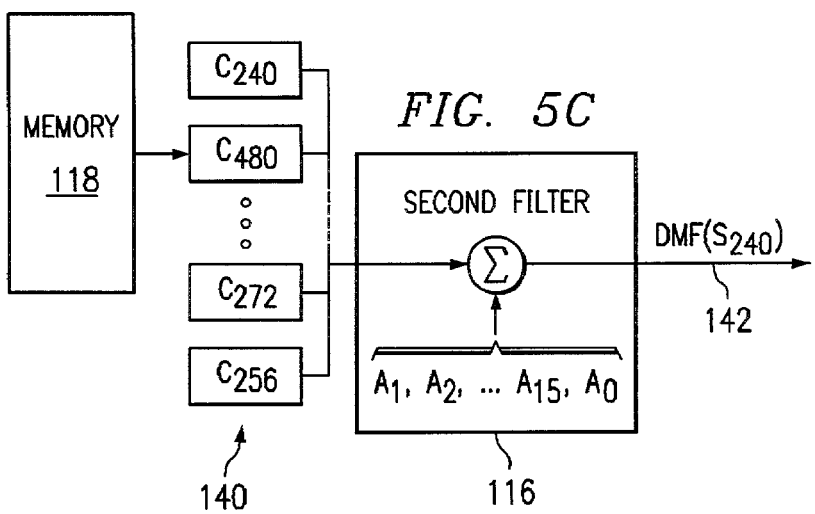
Figure 6A:
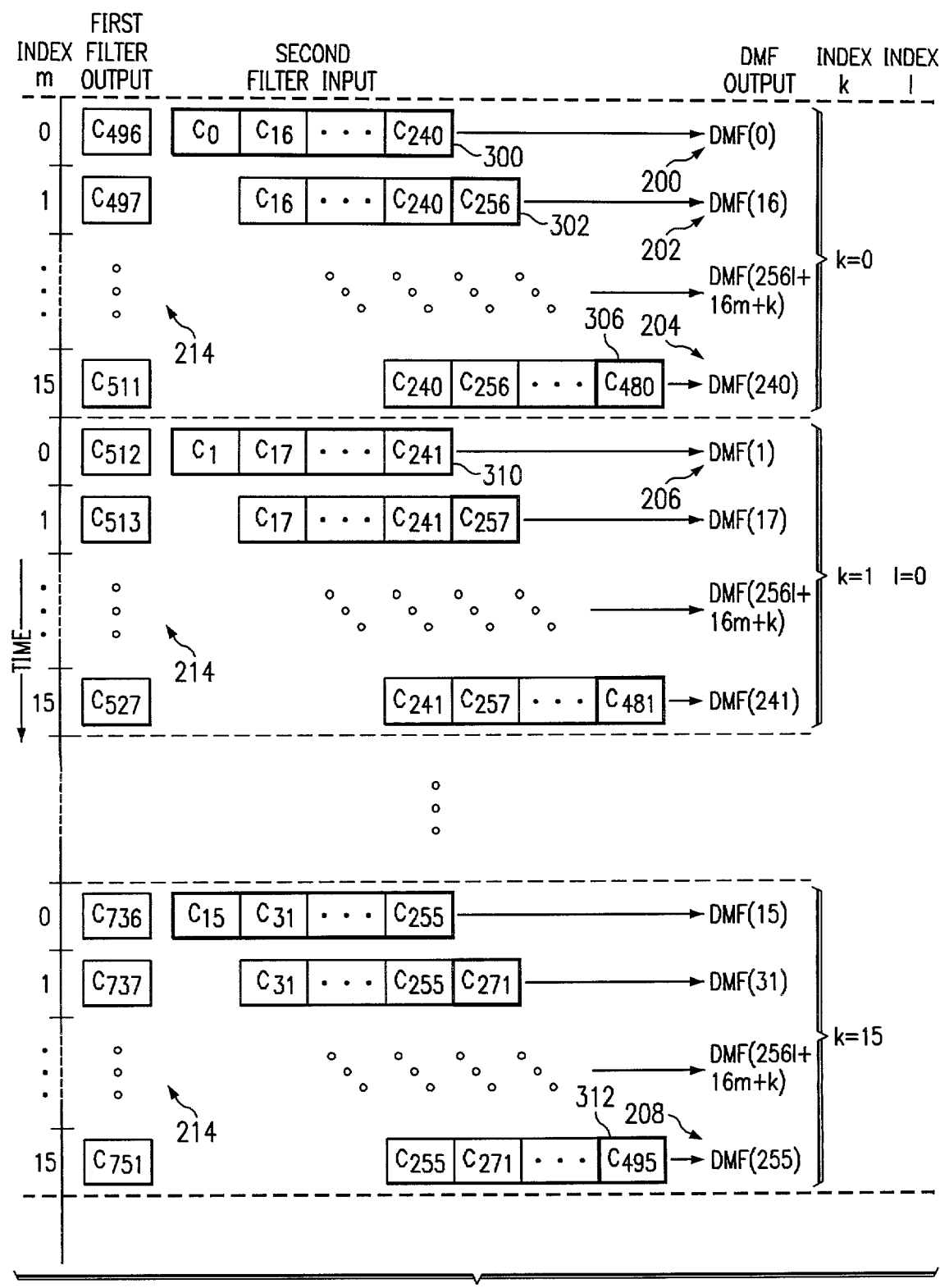
FIG. 6 is a diagram illustrating the permuted order for second filter operation in a preferred implementation of the matched filter of FIG. 2A.
Figure 6B:
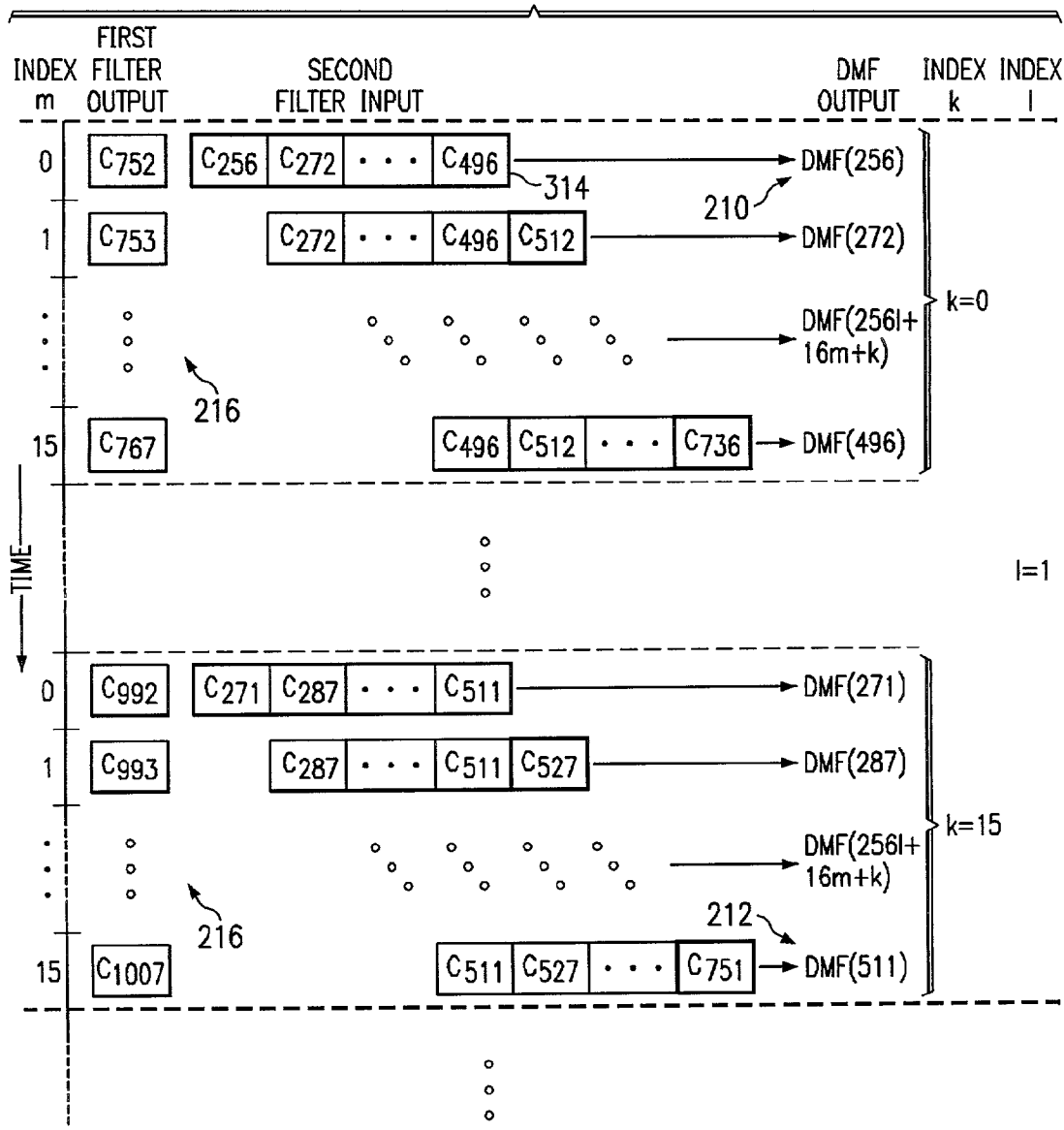

For example, when l=0, k=0 and m=0 (for j=0 to M−1), the intermediate values $c_0, c_{16}, \ldots, c_{224}, c_{240}$ are all retrieved from memory (as indicated by the bold box 300 in FIG. 6 and reference 140 in FIG. 5A). At this point, the filtered output value $DMF(S_0)$ is computed by applying the M values of the "A" series against selectively retrieved (previously computed and saved) intermediate values $c_0, c_{16}, \ldots, c_{224}, c_{240}$ (see, FIG. 6, reference number 200 as well as FIG. 5A) Next, when k=0 and m=1 (again, for j=0 to M−1), a single new intermediate value ($c_{256}$) needed for the next successive filtered output value calculation is retrieved from memory (see, reference 140 in FIG. 5B, and bold box 302 in FIG. 6). The next successive filtered output value $DMF(S_{16})$ is then computed by applying the same "A" series values against the partially reused set of intermediate values $c_{16}, c_{32}, \ldots, c_{240}, c_{256}$ (see, FIG. 6, reference number 202 as well as FIG. 5B). Skipping ahead now to k=0 and m=M−1=15 (again for j=0 to M−1), a single new intermediate value ($c_{480}$) needed for the next successive filtered output value calculation is retrieved from memory (see, reference 140 in FIG. 5C, and bold box 306 in FIG. 6). The next successive filtered output value $DMF(S_{240})$ is then computed by applying the same "A" series values against the partially reused set of intermediate values $c_{240}, c_{256}, \ldots, c_{464}, c_{480}$ (see, FIG. 6, reference number 204 as well as FIG. 5C).

Figure 5D:
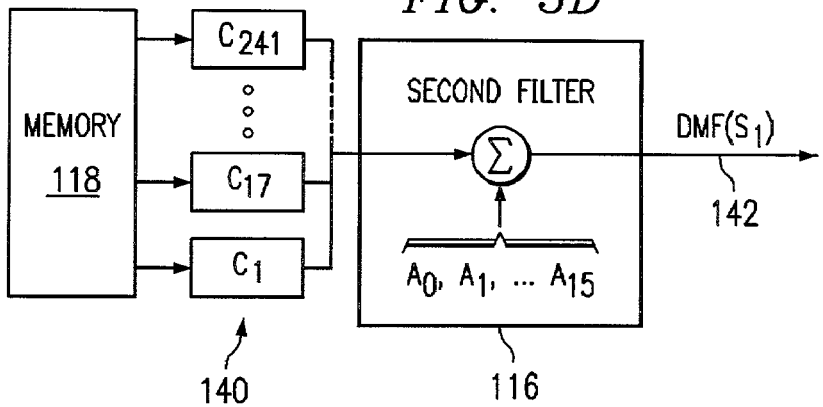

At this point in time, the index k increments, the m index resets to 0, and the process discussed above repeats for the next value of k. It is of interest to note that the next filtered output value to be computed is $DMF(S_1)$ and further to recognize that the intermediate values needed to make this computation were not previously used in connection with the k=0 process described above and illustrated in FIGS. 5A–5C. Thus, for k=1 and m=0 (again for j=0 to M−1), the intermediate values $c_1, c_{17}, \ldots, c_{225}, c_{241}$ are all retrieved from memory (as indicated by the bold box 310 in FIG. 6 and reference 140 in FIG. 5D). Now, the filtered output value $DMF(S_1)$ is computed by applying the same "A" series values against the selectively retrieved (previously computed and saved) intermediate values $c_1, c_{17}, \ldots, c_{225}, c_{241}$ (see, FIG. 6, reference number 206 as well as FIG. 5D).

Figure 5E:
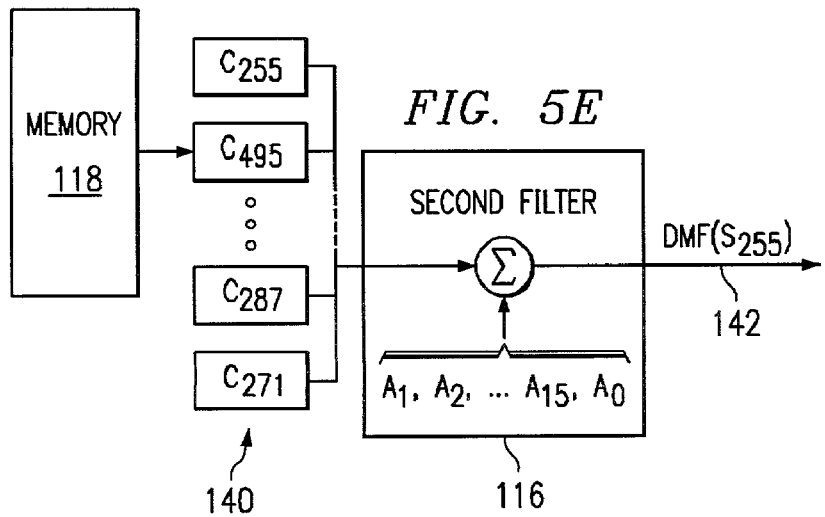

The indices k and m are further incremented in the manner described above, and correlations performed using the addressed intermediate values to output permuted order filtered output value until k=N−1=15 and m=M−1 =15. At that point, a single new intermediate value ($c_{495}$) needed for the next successive filtered output value calculation is retrieved from memory (see, reference 140 in FIG. 5E, and bold box 312 in FIG. 6). The next successive filtered output value $DMF(S_{255})$ is then computed by applying the same "A" series values against the partially reused set of intermediate values $c_{255}, c_{271}, \ldots, c_{479}, c_{495}$ (see, FIG. 6, reference number 208 as well as FIG. 5E).

Figure 5F:
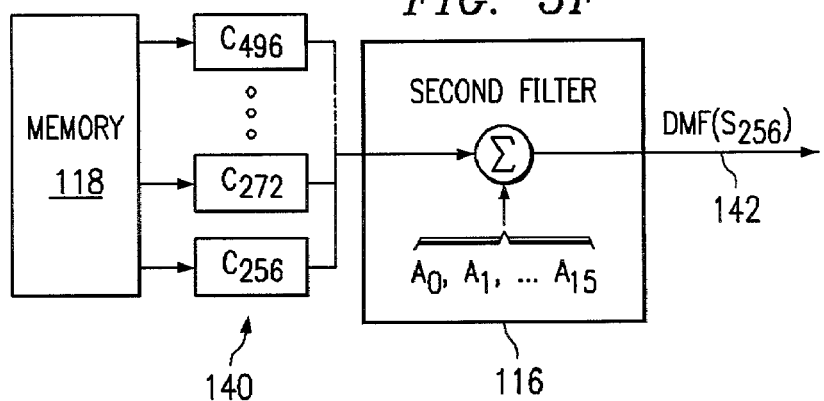

At this point in time, both the index k and the index m are reset to 0, the l index is incremented (l=1), and the process starts all over again, but with the DMF index starting at 256 (see, FIG. 6, reference number 210). For example, when l=1, k=0 and m=0 (for j=0 to M−1), the intermediate values $c_{256}, c_{272}, \ldots, c_{49}$, are all selectively retrieved from memory (as indicated by the bold box 314 in FIG. 6 and reference 140 in FIG. 5F). At this point, the filtered output value DMF ($S_{256}$) is computed by applying the M values of the "A" series against the selectively retrieved (previously computed and saved) intermediate values $c_{256}, c_{272}, \ldots, c_{496}$ (see, FIG. 6, reference number 210 as well as FIG. 5F).

When the filter 112 is used in many applications, including for example the cell searcher 10 of FIG. 1, the permuted output order of the filtered output values $DMF(S_n)$ is of no concern. Taking the cell searcher 10 of FIG. 1 as a specific but not limiting example, the maximum energy finder 14 does not operate to process the filtered output values DMF ($S_n$) in the natural order of the index n. Rather, the filtered output values $DMF(S_n)$ are accumulated by the maximum energy finder 14 over several time slots in a memory dedicated to storing the highest energy paths for further processing. The specific order that the filtered output values $DMF(S_n)$ are received does not matter as long as each value is eventually known and accounted for in accumulating and making the highest energy decision. Other applications using the filter 112 that similarly do not care about the order with which the filtered output values $DMF(S_n)$ are provided (for example, when the output is buffered prior to further processing) are known to those skilled in the art and can thus take advantage of the preferred implementation of the filter 112.

To better understand the operation of the preferred implementation, assume that the memory 118 has pre-stored the intermediate values necessary for performing each individual second filtering operation for a complete cycling of the index k from 0 to N−1. It should be recognized that the first and second filters operate concurrently but are offset from each other in time. By this it is meant that for a given filtering operation performed by the second filter 116, the first filter 114 must have previously produced, and the memory 118 must have previously saved, those intermediate values that are necessary for use in the second filtering operation. This does not mean that ALL intermediate values for the input must be pre-computed and stored. Rather, only those intermediate values necessary for making DMF calculations in the permuted order need to have been previously calculated by the first filter and stored in memory (i.e., those intermediate values required for the DMF to cycle index k from 0 to N−1).

The foregoing may be better understood with reference once again to FIG. 6 and a specific (but not necessarily limiting) example. For the DMF operation illustrated in FIG. 6 for l=0 and k=0 to 15, $DMF(S_0)$ to $DMF(S_{255})$ are calculated and output (in permuted order) using the calculated and output (in natural order) intermediate values $c_0$ to $c_{495}$. These intermediate values $c_0$ to $c_{495}$, however, were previously calculated and output by the first filter for storage in memory (as generally indicated at reference 212). Thus, during the time period illustrated when $DMF(S_0)$ to $DMF(S_{255})$ are being calculated and output using the previously stored intermediate values $c_0$ to $c_{495}$, the first filter 114 is concurrently calculating and outputting the intermediate values $c_{496}$ to $c_{751}$ (see, generally at reference 214) to be used in DMF calculation for the next cycle of the index k. Now, when k resets from 15 to 0, and l increments to l=1, as indicated between references 208 and 210, the intermediate values $c_0$ to $c_{255}$ are no longer needed for second filter 116 processing and may be discarded. At this point, the intermediate values $c_{496}$ to $c_{751}$ that were calculated and output by the first filter during second filter determination of $DMF(S_0)$ to $DMF(S_{255})$ are then used, along with the even earlier calculated and stored intermediate values $c_{256}$ to $c_{495}$, as the index k increments from 0 to 15 in connection with the calculation and output of $DMF(S_{256})$ to $DMF(S_{511})$, as shown starting with reference 210. Similarly, during the time period when $DMF(S_{256})$ to $DMF(S_{511})$ are being calculated and output using the intermediate values $c_{256}$ to $c_{751}$, the first filter is calculating and outputting the intermediate values $c_{752}$ to $c_{1007}$ (see, generally at reference 216). When k resets again from 15 to 0 (see, reference 212), and l increments to l=2 (not illustrated), the intermediate values $c_{256}$ to $c_{511}$ are no longer needed for second filter 116 processing and may be discarded. As discussed above, the process repeats itself, each time taking advantage (within the cycling of the index k) of the previously calculated and stored first filter outputs of intermediate values, and discarding from memory those values which are no longer needed.

The timing relationship between the calculation of the intermediate values $c_n$ (in natural order) for storage in memory and the calculation and output of the DMF values (in permuted order) is better illustrated in a more general fashion in FIG. 7. It will be noted that intermediate values to $c_{495}$ are calculated (in natural order—reference 230) for storage before any DMF values are determined. Thereafter, and while the subsequent intermediate values to $c_{751}$ are calculated (in natural order—reference 232) for storage, the DMF values to $DMF(S_{255})$ are determined 234 in permuted order using the intermediate values to $c_{495}$ that are retrieved from storage in the manner described above. Next, and while the subsequent intermediate values to $c_{1007}$ are calculated (in natural order—reference 236) for storage, the DMF values to $DMF(S_{511})$ are determined 238 in permuted order using the intermediate values from $c_{256}$ to $c_{751}$ that are retrieved from storage in the manner described above. The process then continues in the manner and relationship shown to simultaneously determine intermediate values and DMF values with a time offset.

Reference is now once again made to FIGS. 3 and 5A–5F. It will be remembered that the first filter 114 correlates the incoming signal $S_n$ and outputs intermediate values of $c_n$ in natural order on data line 138 for storage in the memory 118 at specified addresses. It will also be remembered that the second filter 116 retrieves intermediate values from memory 118 at the specified addresses for correlation to produce the DMF values in permuted order. The foregoing raises the issue of how the memory 118 is to be addressed (for example by the controller 120) for both storing and retrieving intermediate values.

It is important that the filter 112 operate with minimal latency and memory size. Such constraints dictate that the intermediate data should be stored in memory for only as long as it is needed, and thus this data should be overwritten as soon as possible. It is recognized with the second filtering operation of the present invention that the intermediate data is not retrieved from the memory in the same order (i.e., the natural order) with which the data is produced and delivered by the first filter. However, once the data is retrieved from memory, and if it is not needed later for further correlation calculations, the newly delivered intermediate data from the first filter may be stored by overwriting at the addresses previously occupied by the retrieved (and no longer needed) data. In this way, the size of the memory necessary for filter 112 operation may be kept to a minimum.

This addressing process for writing data to memory may be better understood with reference to FIGS. 6 and 7 and the specific example illustrated therein. As discussed above, the intermediate values of $c_n$ to $c_{495}$ are calculated (in natural order—reference 230 of FIG. 7) for storage before any DMF values are determined. Since the memory 118 is presumably empty prior to this operation, the produced intermediate values to $c_{495}$ may be sequentially (i.e., linearly) stored at addresses 0 to 495 as specified by the index n. In this context, 2×N×M−N=496 identifies the smallest permitted memory size (in terms of words).

Now, determination of DMF values begins. The first DMF value produced ($DMF(S_0)$) is calculated from, among other intermediate values, the intermediate value $c_0$ stored at address n=0. Once used for this DMF calculation, the intermediate value $c_0$ is no longer needed for further second filter correlations, and the newly produced intermediate value $c_{496}$ may overwrite the intermediate value $c_0$ at address n=0 in memory 118 (as discussed below, this is not the most desirable implementation). Next, the second DMF value produced ($DMF(S_{16})$) is calculated from, among other intermediate values, the intermediate value $c_{16}$ stored at address n=16. Once used for this DMF calculation, the intermediate value $c_{16}$ is no longer needed for further second filter correlations, and the newly produced intermediate value $c_{497}$ may overwrite the intermediate value $c_{16}$ at address n=16 in memory.

Figure 8:
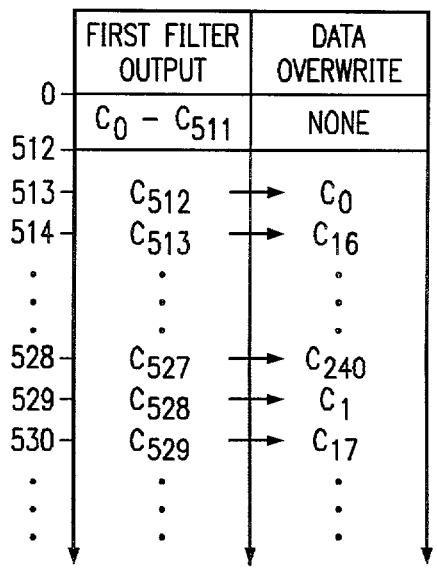
FIG. 8 illustrates a data replacement operation for the memory.

For reasons discussed below, a 512-word memory, even though slightly sub-optimal in size, is preferably used for the memory 118. This still results in a second filter 116 latency of 496-chips (and an overall filter 112 latency of 512 chips due to a first filter 114 latency of 16-chips). FIG. 8 illustrates the data replacement operation performed with respect to a memory 118 having 512 words where overwrite does not start until intermediate value $c_{512}$ is produced by the first filter 114.

More generally, it is assumed that the ordering of intermediate values to the memory addresses starts, as discussed above, with a sequential (or linear) order denoted as "L" where each word $c_n$ is preceded in memory address by its previous word $c_{n-1}$ and followed by its subsequent word $c_{n+1}$. New words $c_n'$ are then overwritten in a permuted order denoted as "P" such that:

$$P:[0,511] \rightarrow [0,511]$$

$$\begin{cases} P(n) = P_1(n) & 0 \leq n < 255 \\ P(n) = P_1(n-256)+256 & 256 \leq n < 511 \end{cases}$$

wherein:

$$\forall\, n \in [0, 255],\ P_1(n) = \frac{n}{16} + ((16n) \bmod 256),\ \text{and}$$

n=(n') mod 512 with the division recited above being an integer division. The generalization of the permutation P to any 2×N×M-long memory is:

$$P(n)=P_1(n)\quad 0 \leq n < N \times M$$

$$P(n)=P_1(n-N \times M)+N \times M\quad N \times M \leq n < 2 \times N \times M-1$$

wherein:

$$P_1(n)=(n/M)+(Nx(n \bmod M))=(n/M)+((Nn) \bmod (NM))$$

n=(n') mod (NM)

with the divisions recited above being integer divisions. $P_1$, and hence P, is remarkable for two reasons (where N=M=16):

first, its bit-wise expression consists in a mere half-byte or "nibble swap" operation as follows:

$$P_1(\underline{b_7 b_6 b_5 b_4}\ \underline{b_3 b_2 b_1 b_0}) = \underline{b_3 b_2 b_1 b_0}\ \underline{b_7 b_6 b_5 b_4} \quad (5a)$$

second, as a result, it is 2-periodic by auto-composition:

$$P_1^2 = P_1 \circ P_1 = L_{[0,255]} \quad (5b)$$

Consequently, with the choice of a memory size of 512 words, when the memory write operation overwrites the intermediate values for the first time, the memory organization is completely permuted from its original linear state. Then, when the memory write operation overwrites the intermediate values for a second time, the memory organization reverts from the permuted state back to a linear state. This bitwise permutation is a property that holds for any N and M such that N=M and is further equal to a power of two.

Figure 9:
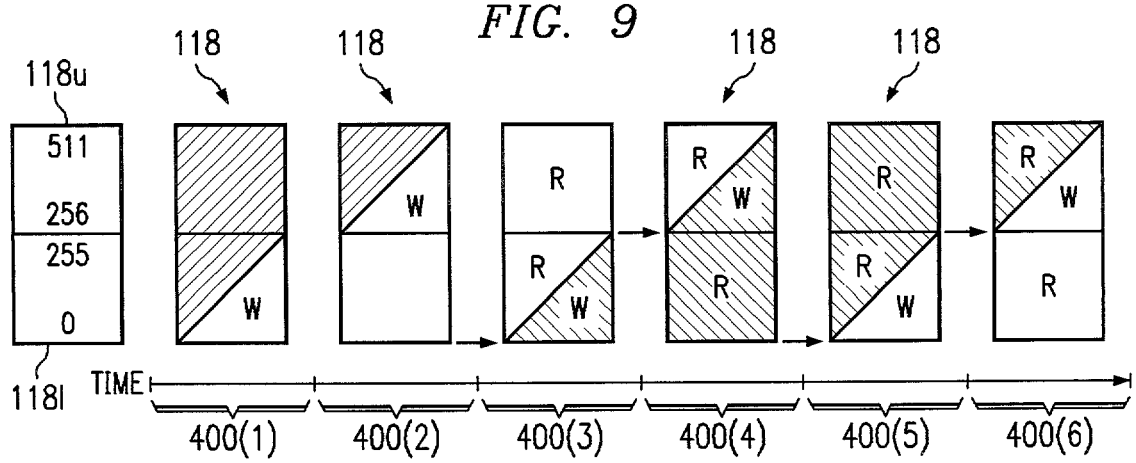
FIG. 9 graphically illustrates memory organization reversion.

This reversion of memory organization is graphically shown in FIG. 9. The memory 118 may be divided into a lower section 118l and an upper section 118u. Time is divided into periods 400, each of which being 256-chips long. The first two periods 400(1) and 400(2) are devoted to first filter operation to fill the memory 118, where the natural order produced intermediate values are sequentially (linearly) stored at the addresses n=0 to n=511 in an L-linear order. At the end of the second period 400(2), the memory 118 is full. Now, any further intermediate values produced must overwrite previously stored values (subject to the offset of 16-chips discussed above which is ignored here to simplify the discussion). In the third period 400(3), the intermediate values previously stored in the memory lower section 118l and upper section 118u are read and retrieved for second filter processing out of the linear order. However, during period 400(3), the read values from the memory lower section 118l are also overwritten with new intermediate values in the P-permuted order. Thereafter, in the fourth period 400(4), the intermediate values previously stored in the memory upper section 118u are read and retrieved for second filter processing out of the linear order, and are accordingly overwritten with new intermediate values also in the P-permuted order. During this fourth period 400(4), however, the values previously stored in permuted order in the lower section 118l are read and retrieved for second filter processing in linear order. At this point (i.e., at the end of the fourth period 400(4)), the memory is still full, but it is now completely in permuted order. Next, in the fifth period 400(5), the intermediate values previously stored (in the third period 400(3)) in the memory lower section 118l and upper section 118u are read and retrieved for second filter processing in linear order. However, during this period 400(5), the read values from the memory lower section 118l are overwritten with new intermediate values in the L-linear order. Thereafter, in the sixth period 400(6), the intermediate values previously stored (in the fourth period 400(4)) in the memory upper section 118u are read and retrieved for second filter processing in linear order, and are accordingly overwritten with new intermediate values also in the L-linear order. During this sixth period 400(6), however, the values previously stored in the linear order in the memory lower section 118l are read and retrieved for second filter processing in permuted order. At this point (i.e., at the end of the sixth period 400(6), the memory is still full, but it is now reverted back completely to linear order (as at the beginning of third period 400(3)). The process then repeats itself with the ordering of writing to the memory alternating between linear and permuted, and the order of reading from the memory alternating between permuted and linear.

It is accordingly recognized that data reads from the memory 118 follow an opposite scheme to that of data writes. More specifically:

when the memory 118 is L-ordered such that the consecutive intermediate values ( . . . , $c_{n-1}$, $c_n$, $c_{n+1}$, . . . ) are being stored at addresses corresponding to the index n, then read access is performed in P-order such that the intermediate values ( . . . , $c_n$, $c_{n+16}$, $c_{n+32}$, . . . ) are being retrieved out of order from addresses corresponding to the permutation of index n; and when the memory 118 is P-ordered such that the consecutive intermediate values ( . . . , $c_{n-1}$, $c_n$, $c_{n+1}$, . . . ) are being stored at addresses corresponding to the permutation of index n, then read access is performed in L-order such that the intermediate values ( . . . , $c_n$, $c_{n+16}$, $c_{n+32}$, . . . ) are being retrieved out of order from addresses corresponding to the index n.

The write addressing performed by the controller 120 on the memory 118 accordingly comprises writing successively into the memory sections 118d and 118u either: (a) sequentially (i.e., L-ordered) or (b) out-of-order (i.e., P-ordered). This scheme repeats once every 1024 chip periods because the write permutation cycles over 1024 chips. The write address W in memory 118 can be derived at time n (i.e., the chip period units) as follows:

$$W(n) = 256 \underbrace{\frac{n \bmod 512}{256}}_{0,256} + \underbrace{P^{\frac{n \bmod 1024}{512}}}_{0,1} (n \bmod 256) \tag{6}$$

In binary representation, the above Equation (6) simplifies to:
if the memory is I-ordered, then the address is:
W=n mod 512; and
if the memory is P-ordered, then the address is:

$$W = \text{nibble\_swap}(n \bmod 512) + \begin{cases} 0 \\ 256 \end{cases}$$

wherein: nibble_swap refers to the operation defined above in Equation (5a).

The read address, on the other hand, simply involves applying the P-order when the memory 118 is in L-order, and applying the L-order when the memory 118 is in P-order. The read offset is either 0 or 256 depending on the series calculated.

Write and read addressing schemes are represented at bit level in FIG. 10 and may be implemented by the controller 120 in FIG. 2A. Again, this discussion assumes for simplicity that there is no 16-chip offset as discussed above. In FIG. 10, the read address counter ranges from 0–511 and is incremented twice each chip (this allows two read access per chip period). Its nine-bit binary representation is denoted: $b_8$–$b_0$. The write address counter also ranges from 0–511, but because one intermediate value is generated by the first filter per chip, this counter is incremented once each chip. It therefore is a chip counter, and its nine-bit binary notation is denoted: $b_9$–$b_1$, where $b_8$–$b_1$ are the same as for the read address counter. Lastly, a global counter (c2x_cnt) is used to describe the read and write generators as well as the memory state (i.e., either P-ordered or L-ordered). This counter has half chip resolution (for read addressing) and is modulo 1024 chips (for memory state description). Its eleven-bit binary notation is denoted: $b_{10}$–$b_0$ where $b_9$–$b_0$ are the same as for the read and write counters. The state of the memory sections 116$l$ and 118$u$ are denoted by P (for permuted) and L (for linear). The shaded boxes in the address portion of FIG. 10 indicate linear or nibble-swap addressing being performed.

Reference is now made to FIG. 2B wherein there is shown a block diagram of a specific implementation of the hierarchical digital matched filter 112 shown in FIG. 2A. This filter may be used in the cell searcher 10 illustrated in FIG. 1. The filter 112 includes a pair of finite impulse response filters 114 (N-tap) and 116 (M-tap). A memory 118 is positioned between the two filters 114 and 116. A controller 120 is connected to the filters 114 and 116, as well as to the memory 118, and operates to control overall filter 112 operation and coordinate the processing activities among and between the two filters 114 and 116 and the memory 118.

The controller 120 outputs filter enable signals 126 and 128 to the two filters 114 and 116, respectively. These signals provide an instruction to the filters 114 and 116 to begin processing and are used to coordinate the timing of the processing and data handling operations performed within the filter 112. An address bus 130 extends between the controller 120 and memory 118 and is used by the controller to specify the address in memory where data is to be either stored or read. The operation to selectively read from or write to the memory 118 (i.e., to have the memory perform a memory read or a memory write) is specified by the controller 120 using a read enable signal 132 or a write enable signal 134, respectively. The unique addressing scheme described above is implemented by the controller 120 using the bus 130 and signals 132 and 134.

The first filter 114 receives an input signal ($S_n$) 136 (both I and Q), performs a designated filtering operation thereon, and outputs filtered intermediate data c on data line 138 to the memory 118 where it is stored at the address specified by the controller 120 on the address bus 130 (see also, FIG. 3). Although the description herein specifies the processing of I and Q phases of the signal 136, it will be understood that the filter 112 may equally be implemented for one-dimensional signal processing as well. Responsive to controller 120 instruction, the memory 118 selectively retrieves stored intermediate data c from an address specified on the address bus 130 and passes the retrieved intermediate data c on data line 140 to the second filter 116. As discussed above, the retrieval of the data is offset in time from its storage as illustrated in FIGS. 6 and 7. The second filter 116 performs a designated filtering operation on the received intermediate data c and outputs a filtered output (DMF($S_n$)) signal on line 142. As discussed above, and as illustrated in FIGS. 5A–5F, as well as FIGS. 6 and 7, the filtered output (DMF($S_n$)) signals are produced in a permuted order relative to the order with which the input signal is received.

Although not required, the memory 118 may be split into two banks. This allows for simultaneous reads from and writes to memory 118 to be performed by the controller 120 and thus allow the operations of the first and second filters to occur simultaneously. These memory banks 144 may each comprise, for example, synchronous single ported RAMs. The controller 120 further outputs a bank select signal 146, in combination with the read enable signal 132 and the write enable signal 134, to the memory 118 to choose which of the banks 144 is currently enabled for a certain memory operation. This implementation is further illustrated in FIG. 8. As an alternative, a dual port RAM may be used for the memory 118. Still further, if the clock frequency for memory operation is high enough (for example, four time the data throughput rate), a conventional RAM may be used without degradation in performance.

The filter 112 of the present invention may be implemented in either hardware or software or a combination of both. For example, the first and second filters as well as the controller may each comprise hardware implementations (for example, configured onto an integrated circuit). In a software implementation, a digital signal processor (DSP) or micro-controller (MCU) may be used to implement the algorithm of the filtering operation. Notwithstanding this implementation, the first filter may be implemented in hardware, with the memory comprising a software mailbox with the second filter implemented using DSP techniques. In the event the first and second filters are implemented using a DSP, it is possible that the DSP will have to alternate between first filter and second filter operations.

The memory-based implementation of the present invention provides substantial power consumption and silicon area advantages over the prior art direct N×M filtering operation. As an example, synthesizing tools known to those skilled in the art (for example, for transforming an RTL description to a gate level description) were used to synthesize both the prior art direct filtering architecture and the memory-based architecture (assuming two samples per chip) of the present invention for comparison. For a 1-bit input (for each of I and Q), significant power consumption gains were achieved in the simulation with use of the memory-based architecture (1.0 mW vs 2.1 mW) with some advantage in silicon area use (0.27 mm$^2$ vs 0.28 mm$^2$). For a 2-bit input (for each of I and Q), significant power consumption gains were achieved in the simulation with use of the memory-based architecture (1.2 mW vs 3.5 mW) with a significant advantage in silicon area use (0.31 mm$^2$ vs 0.54 mm$^2$). Similarly, for a 4-bit input (for each of I and Q), significant power consumption gains were achieved in the simulation with use of the memory-based architecture (1.9 mW vs 6.3 mW) with a significant advantage in silicon area use (0.39 mm$^2$ vs 0.76 mm$^2$). Notably, for each simulation, the gaps concerning power consumption and silicon area use between the memory-based architecture and the prior art architecture widen as the bit-width increases.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for correlating an input signal against a code wherein the code is comprised of a first pattern modulated with a second pattern, comprising the steps of:
   first filtering the input signal comprised of a sequence of values received in a natural temporal order with the first pattern to produce a sequence of intermediate values in the same natural temporal order of the input signal;
   storing the intermediate values in a memory;
   retrieving certain ones of the intermediate values from the memory; and
   second filtering of the retrieved certain ones of the intermediate values with the second pattern to produce a sequence of output values in a permuted temporal order with respect to the natural temporal order of the input signal so as to reuse some of the previously retrieved certain ones of the intermediate values in successive second filtering steps.

2. The method as in claim 1 wherein the code comprises a primary synchronization code (PSC) for cell search slot synchronization.

3. The method of claim 1 wherein:
   the step of retrieving comprises the step of retrieving a first intermediate value and a group of intermediate values;
   the step of second filtering then produces a first output value using the second pattern from the first intermediate value and the group of intermediate values;
   the step of retrieving then further comprises the step of retrieving a second intermediate value; and
   the step of second filtering then further produces a second output value using the second pattern from the second intermediate value and the group of intermediate values, thus reusing the group of intermediate values in successive second filtering steps.

4. The method of claim 1 wherein:
   the step of second filtering produces a first output value using the second pattern and a combination of a first intermediate value and a group of intermediate values;
   the step of retrieving then further comprises the step of replacing the first intermediate value with a second intermediate value; and
   the step of second filtering is then repeated to produce a second output value using the second pattern and a combination of the second intermediate value and the group of intermediate values, thus reusing the group of intermediate values in successive second filtering steps.

5. The method as in claim 1 wherein the step of storing comprises the steps of:
   writing to addresses in a linear order to store a first group of intermediate values produced by the step of first filtering;
   overwriting in a permuted order values located at the addresses storing the first group of intermediate values to store a second group of intermediate values next produced by the step of first filtering; and
   overwriting in a linear order values located at the addresses storing the second group of intermediate values to store a third group of intermediate values next produced by the step of first filtering.

6. The method as in claim 5 wherein the step of retrieving comprises the steps of:
   retrieving the first group of intermediate values in permuted order from addresses where the second group of intermediate values is being stored; and
   retrieving the second group of intermediate values in linear order from addresses where the third group of intermediate values is being stored.

7. A hierarchical filter comprising:
   a first filter operating to correlate a received input signal comprised of a sequence of values received in a natural temporal order with a first pattern to produce a sequence of intermediate values in the same natural temporal order of the received input signal;
   a memory for temporarily storing the intermediate values; and
   a second filter operating to retrieve certain ones of the intermediate values stored in the memory and correlate the retrieved certain ones of the intermediate values with a second pattern to produce a sequence of output values, the sequence of output values produced in a permuted temporal order with respect to the natural temporal order of the received input signal so as to allow reuse in the second filter of some of the previously retrieved certain ones of the intermediate values in successive second filter correlations.

8. The hierarchical filter as in claim 7 wherein the filter is implemented as an integrated circuit on an integrated circuit chip.

9. The hierarchical filter as in claim 7 wherein the filter is implemented in software.

10. The hierarchical filter as in claim 7 wherein the first filter is implemented in hardware and the second filter is implemented in software.

11. The hierarchical filter as in claim 7 further including a memory controller, the memory controller operable to control the writing of intermediate values to, and the reading of intermediate values from, the memory, the memory controller operating to:
    write to addresses in the memory in a linear order to store a first group of intermediate values produced by the first filter;

overwrite in a permuted order values located at the addresses storing the first group of intermediate values to store a second group of intermediate values next produced by the first filter; and overwrite in a linear order values located at the addresses storing the second group of intermediate values to store a third group of intermediate values next produced by the first filter.

12. The hierarchical filter as in claim 11 wherein the memory controller further operates to:

read the first group of intermediate values in permuted order from addresses where the second group of intermediate values is being overwritten; and read the second group of intermediate values in linear order from addresses where the third group of intermediate values is being overwritten.

13. The hierarchical filter as in claim 7 wherein the code comprises a primary synchronization code (PSC) for cell search slot synchronization.

14. The hierarchical filter as in claim 7 wherein the second filter operates as follows:

first, receive a first intermediate value and a group of intermediate values from the memory;

second, correlate a combination of the first intermediate value and group of intermediate values against the second pattern to produce a first output value;

third, receive a second intermediate value from the memory; and fourth, correlate a combination of the second intermediate value and the group of intermediate values against the second pattern to produce a second output value, thus reusing the group of intermediate values in successive second filter correlations.

15. The hierarchical filter as in claim 7 wherein the second filter operates follows:

first, correlate a combination of a first intermediate value and a group of intermediate values against the second pattern to produce a first output value;

second, replace the first intermediate value with a second intermediate value retrieved from memory; and third, correlate a combination of the second intermediate value and the group of intermediate values against the second pattern to produce a second output value, thus reusing the group of intermediate values in successive second filter correlations.

16. A filtering method comprising the steps of:

receiving a sequence of values of an input signal in a natural temporal order; and correlating the received input signal against a code including a first and second sub-code comprising correlating the sequence of input signal values against the first sub-code in the natural temporal order to produce a sequence of intermediate values and correlating the intermediate values against the second sub-code in a permuted temporal order with respect to the natural temporal order of the input signal, wherein the step of correlating comprises the steps of:

first correlating the received input signal against the first sub-code of the code to produce intermediate values in the natural temporal order;

selecting certain ones of the produced intermediate values in an order other than the natural temporal order in which they were produced; and second correlating the selected certain ones of the produced intermediate values against the second sub-code of the code to produce a sequence of output signals in the permuted temporal order.

17. The filtering method of claim 16 wherein the second correlating step comprises the steps of:

correlating a first set of the certain ones of the produced intermediate values against the second sub-code to produce a first output signal; and then correlating a second set of the certain ones of the produced intermediate values against the second sub-code to produce a second output signal;

wherein the first and second sets share substantially the same constituent intermediate values, such that common second intermediate values are reused in successive correlations to produce the first and second output signals in a permuted order.

18. The filtering method of claim 17 wherein the substantially the same constituent intermediate values refers to the successive correlations sharing all the same constituent intermediate values except for one intermediate value.

19. A primary synchronization code (PSC) synchronizer, comprising:

a digital matched filter that receives a sequence of values of an input signal in a natural temporal order, correlates the sequence of input signal values in a first filter against the primary synchronization code by making a first natural temporal order correlation against a first primary synchronization sub-code to produce a sequence of intermediate values in the natural temporal order of the received input signal, storing the intermediate values in memory and making a second permuted order correlation in a second filter by retrieving certain ones of the intermediate values for correlation against a second primary synchronization sub-code to produce a sequence of output energies in a permuted temporal order with respect to the natural temporal order of the received input signal so as to allow reuse in the second filter of some of the previously retrieved certain ones of the sequence of intermediate values in successive second permuted order correlations, and outputs the sequence of energies in the permuted temporal order with respect to the input signal; and a maximum energy finder that receives the sequence of output energies in the permuted temporal order and accumulates those output energies over time to detect a peak corresponding to a possible start of a slot.

20. The synchronizer as in claim 19 wherein the searcher is implemented as an integrated circuit on at least one integrated circuit chip.

21. The synchronizer as in claim 19 wherein the searcher is implemented in software.

22. The synchronizer as in claim 19 wherein the searcher is implemented as a combination of hardware and software.

23. The synchronizer as in claim 19 wherein:

the first filter operating to correlate the received input signal with a first pattern of the PSC to produce the sequence of intermediate values in the natural temporal order of the received input signal for storage in the memory; and the second filter operating to retrieve certain ones of the sequence of intermediate values stored in the memory and correlate the retrieved certain ones of the sequence of intermediate values with a second pattern of the PSC to produce the sequence of output energies.

24. The synchronizer as in claim 23 further including a memory controller, the memory controller operable to control the writing of intermediate values to, and the reading of intermediate values from, the memory, the memory controller operating to:
   write to addresses in the memory in a linear order to store a first group of intermediate values produced by the first filter;
   overwrite the addresses storing the first group of intermediate values in a permuted order to store a second group of intermediate values next produced by the first filter; and
   overwrite the addresses storing the second group of intermediate values in a linear order to store a third group of intermediate values next produced by the first filter.

25. The synchronizer as in claim 24 wherein the memory controller further operates to:
   read the first group of intermediate values in permuted order from addresses where the second group of intermediate values is being overwritten; and
   read the second group of intermediate values in linear order from addresses where the third group of intermediate values in being overwritten.

26. The synchronizer as in claim 23 wherein the second filter operates as follows:
   first, receive a first intermediate value and a group of intermediate values from the memory;
   second, correlate a combination of the first intermediate value and group of intermediate values against the second pattern to produce a first output energy value;
   third, receive a second intermediate value from the memory; and
   fourth, correlate a combination of the second intermediate value and group of intermediate values against the second pattern to produce a second output energy value, thus reusing the group of intermediate values in successive second filter correlations.

27. The synchronizer as in claim 23 wherein the second filter operates follows:
   first, correlate a combination of a first intermediate value and a group of intermediate values against the second pattern to produce a first output value;
   second, replace the first intermediate value with a second intermediate value retrieved from memory; and
   third, correlate a combination of the second intermediate value and the group of intermediate values against the second pattern to produce a second output value, thus reusing the group of intermediate values in successive second filter correlations.

* * * * *

UNITED STATES PATENT AND TRADEMARK OFFICE
CERTIFICATE OF CORRECTION

| | | |
|---|---|---|
| PATENT NO. | : 7,194,021 B2 | Page 1 of 1 |
| APPLICATION NO. | : 10/123881 | |
| DATED | : March 20, 2007 | |
| INVENTOR(S) | : Nicolas Darbel et al. | |

It is certified that error appears in the above-identified patent and that said Letters Patent is hereby corrected as shown below:

In the Specification:

At column 11, line number 65, please replace [1181] with -- 118$l$ --.

At column 12, line number 10, please replace [1181] with -- 118$l$ --.

At column 12, line number 13, please replace [1181] with -- 118$l$ --.

At column 12, line number 21, please replace [1181] with -- 118$l$ --.

At column 12, line number 27, please replace [1181] with -- 118$l$ --.

At column 12, line number 30, please replace [1181] with -- 118$l$ --.

At column 12, line number 38, please replace [1181] with -- 118$l$ --.

At column 12, line number 67, please replace [118$d$] with -- 118$l$ --.

At column 13, line number 50, please replace [1161] with -- 116$l$ --.

Signed and Sealed this
Thirteenth Day of September, 2011

David J. Kappos
*Director of the United States Patent and Trademark Office*